United States Patent [19]

Hamade et al.

[11] Patent Number: 5,488,304
[45] Date of Patent: Jan. 30, 1996

[54] METHOD AND APPARATUS FOR JUDGING ACTIVE/DEAD STATUS OF COMMUNICATION CABLE

[75] Inventors: Toshiharu Hamade, Toyamaken; Masaichi Shiotani, Ishikawaken; Yukio Shimo, Ishikawaken; Munehiko Higashikata, Ishikawaken, all of Japan

[73] Assignee: Nippon Telegraph and Telephone Corporation, Tokyo, Japan

[21] Appl. No.: 252,950

[22] Filed: Jun. 2, 1994

[30] Foreign Application Priority Data

Jun. 2, 1993 [JP] Japan .................................. 5-131613

[51] Int. Cl.⁶ ............................................ G01R 31/12
[52] U.S. Cl. ..................... 324/520; 340/658; 324/529
[58] Field of Search ........................ 324/529, 66, 520, 324/537; 455/67.3; 340/657, 658; 385/22, 26, 34

[56] References Cited

U.S. PATENT DOCUMENTS

| | | | |
|---|---|---|---|
| 2,695,399 | 11/1954 | Martin | 324/520 |
| 3,102,231 | 8/1963 | Wolf | 324/520 |
| 3,703,717 | 11/1972 | Kuster | 340/658 |
| 3,882,287 | 5/1975 | Simmonds | 324/66 |
| 4,156,846 | 5/1979 | Harrold | 324/772 |
| 4,833,725 | 5/1989 | Teetor | 455/67.3 |
| 5,047,724 | 9/1991 | Boksiner et al. | 340/520 |
| 5,150,111 | 8/1992 | Fujieda | 340/658 |

FOREIGN PATENT DOCUMENTS

| | | | |
|---|---|---|---|
| 0026227 | 3/1991 | Japan | 340/658 |
| 2235053 | 2/1991 | United Kingdom . | |

*Primary Examiner*—Maura K. Regan
*Attorney, Agent, or Firm*—Banner & Allegretti, Ltd.

[57] ABSTRACT

A scheme for judging an active/dead status of a communication cable, which is capable of making an accurate judgement quickly for each cable laid at a working site. In this scheme, data representing a frequency spectrum of signals on a communication cable measured in a state in which the communication cable is known to be active/dead is stored in advance, and the data representing the frequency spectrum of the signals on a communication cable to be judged is measured by detecting signals on the communication cable to be judged while electromagnetically coupling a probe to the communication cable to be judged. Then, the active/dead status of the communication cable to be judged is judged according to a result of comparing a prescribed threshold with a difference of the data representing the frequency spectrum stored in advance and the data representing the frequency spectrum measured by the probe.

20 Claims, 9 Drawing Sheets

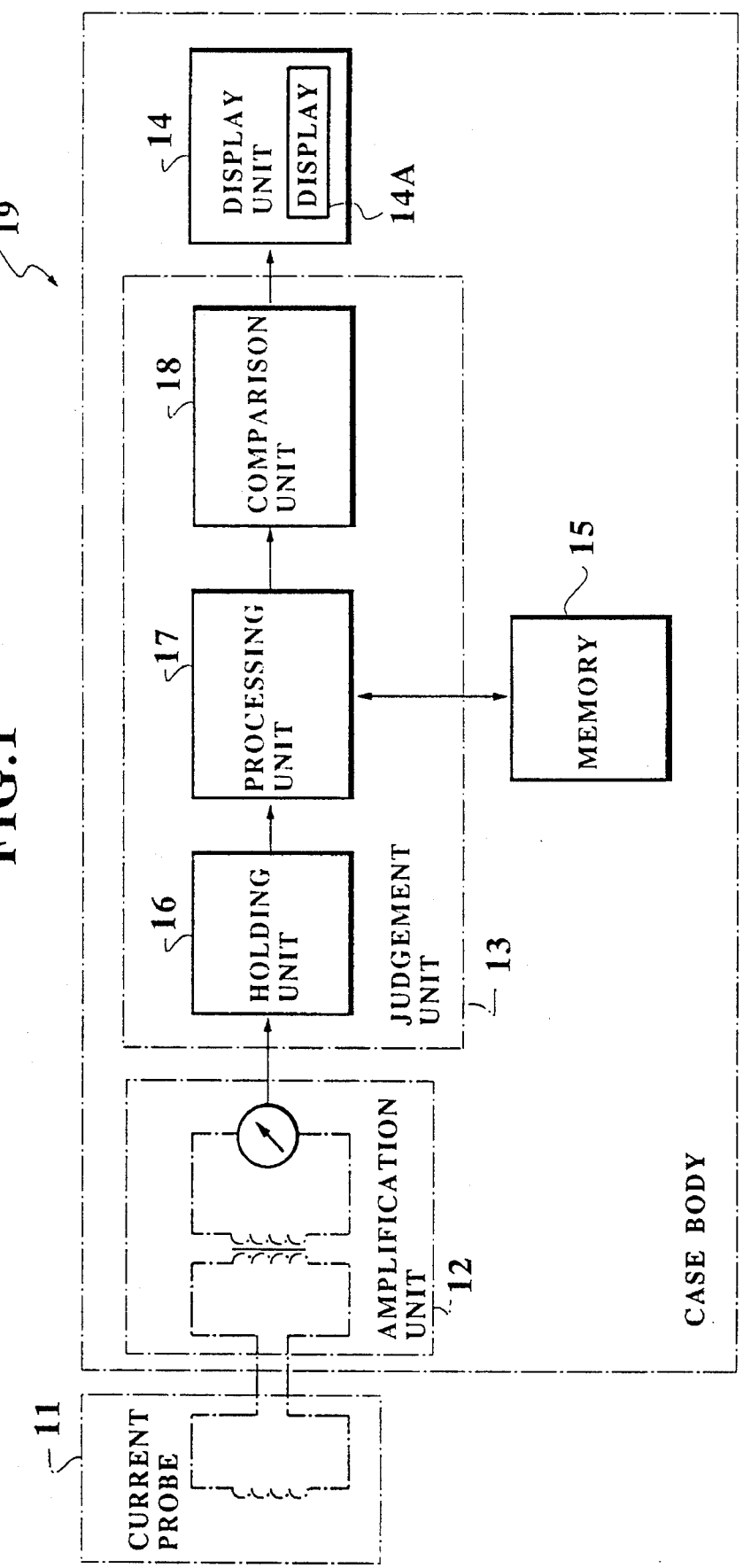

FIG.2A
FIG.2B
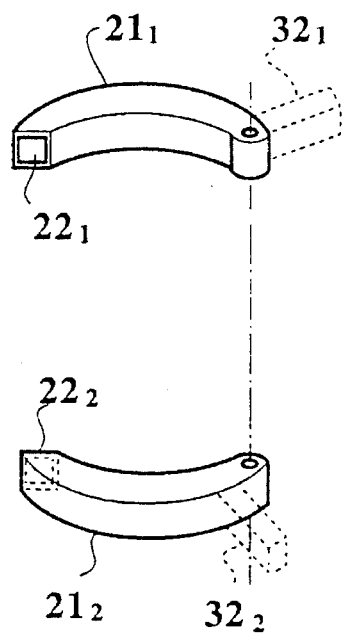
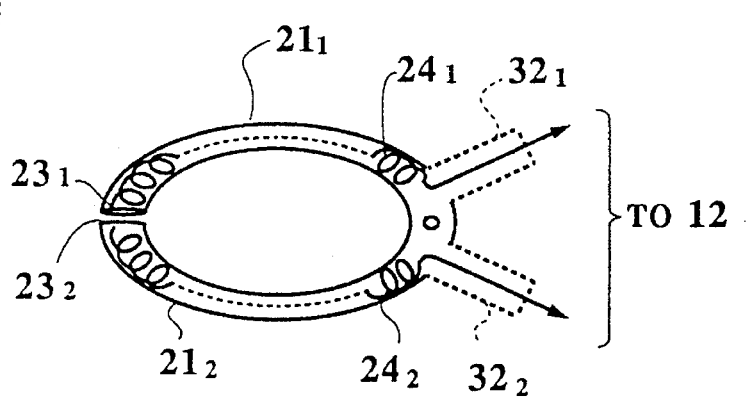
FIG.3
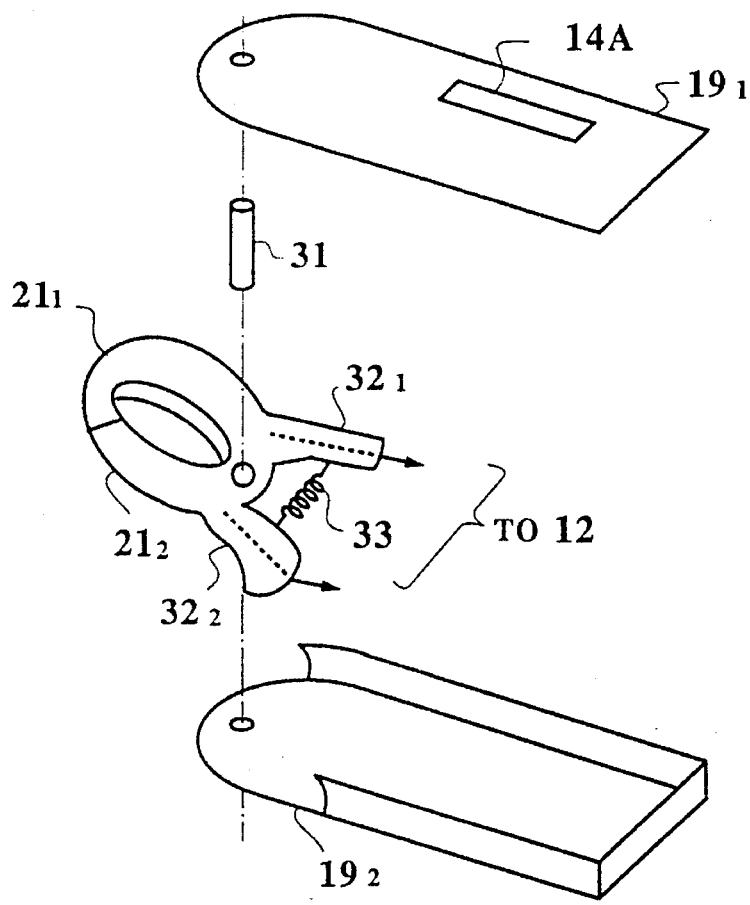

METHOD AND APPARATUS FOR JUDGING ACTIVE/DEAD STATUS OF COMMUNICATION CABLE

BACKGROUND OF THE INVENTION

1. Field of the Invention

The present invention relates to a method and an apparatus for judging whether a metallic cable for communication is In an active status capable of serving for the communication or not.

2. Description of the Background Art

A worker for laying the metallic cable for communication (referred hereafter simply as a cable) through underground or space is required to judge whether each cable is an active line which is capable of transmitting signals by being power supplied from a terminal device, or a dead line which is not in the active status, prior to the work for cutting or removing the unnecessary cables. In such a work, when the active line is cut by mistake due to the erroneous judgement of the active line, some trouble can be caused to the system connected with the erroneously cut active line or the communication service with respect to the terminal contained in that system is interrupted.

Conventionally, there are the following three methods for judging whether the cable to be a target of the above described work is an active line or not.

The first method is to confirm a physically cut off state of the cable at a connection point of a terminal device or a relay point of the cable by the visual inspection, and distinguishably marking the cable to be a target of cable cutting or removing operation by attaching tags along that cable.

The second method is to transmit special monitor signal through the cable From a connection point of a terminal device or a relay point of the cable, and determining a cable located at the working site from which the monitor signal can be received through a receiver device, so as to distinguish the cable to be cut or removed as that From which the monitor signal cannot be received.

The third method is to detect the contact of a cutting blade of a cable cutter used in the cable cutting operation with the conductive cable core, and stopping the cable cutting operation by utilizing the electromagnetic lock mechanism.

However, these conventionally known methods have been associated with the following problems.

Namely, in the first method, it is necessary to confirm the cable to be marked by the visual inspection many times, especially when a position at which a physically cut off state of the cable is confirmed and the cable cutting or removing work site are distanced. As a result, there is a possibility for the other cable to be erroneously marked, especially in a section at which numerous cables are laid densely, and many operation steps are required for the cable cutting or removing operation.

In the second method, the receiver device for detecting the monitor signal is very expensive, and its significantly large mechanical size has been severely limiting a size of the workable working site or interfering with the working performance of the worker. Moreover, in order to detach a oscillator device for transmitting the monitor signal after the completion of the cable cutting or removing work, it has been necessary for the worker to go back from the cable cutting or removing work site to the location at which the oscillator device has been attached at a beginning of the cable cutting or removing work.

In the third method, the specially designed cable cutter capable of functioning In the above described manner is very expensive, and the judgement of the active/dead line cannot be made without cutting through the outer covering of the cable, so that the cable is damaged even when the cutting operation Is stopped by the electromagnetic lock mechanism, and therefor there has been a need to replace the damaged cable with a new one whenever the erroneous cutting of the active line Is prevented by the electromagnetic lock mechanism.

SUMMARY OF THE INVENTION

It is therefore an object of the present Invention to provide a method and an apparatus for judging an active/dead status of a communication cable, which is capable of making an accurate judgement of the active/dead status quickly for each cable laid at a working site.

According to one aspect of the present invention there is provided a method for judging an active/dead status of a communication cable, comprising the steps of: storing in advance data representing a frequency spectrum of signals on a communication cable measured in a state in which the communication cable is known to be active/dead; measuring the data representing the frequency spectrum of the signals on a communication cable to be judged by detecting signals on the communication cable to be judged while electromagnetically coupling a probe to the communication cable to be judged; and judging the active/dead status of the communication cable to be judged according to a result of comparing a prescribed threshold with a difference the data representing the frequency spectrum stored at the storing step and the data representing the frequency spectrum measured at the measuring step.

According to another aspect of the present invention there is provided an apparatus for judging an active/dead status of a communication cable, comprising: memory means for storing In advance data representing a frequency spectrum of signals on a communication cable measured in a state in which the communication cable is known to be active/dead; measurement means having a probe for measuring the data representing the frequency spectrum of the signals on a communication cable to be judged by detecting signals on the communication cable to be judged while electromagnetically coupling the probe to the communication cable to be judged; and judgement means for judging the active/dead status of the communication cable to be judged according to a result of comparing a prescribed threshold with a difference of the data representing the frequency spectrum stored by the memory means and the data representing the frequency spectrum measured by the measurement means.

Other features and advantages of the present invention will become apparent from the following description taken in conjunction with the accompanying drawings.

BRIEF DESCRIPTION OF THE DRAWINGS

FIG. 1 is a schematic block diagram of one embodiment of a cable status judgement apparatus according to the present invention.

FIGS. 2A and 2B are external and internal perspective views of a current probe in the apparatus of FIG. 1.

FIG. 3 is an expanded view of a case body and a current probe in the apparatus of FIG. 1.

DETAILED DESCRIPTION OF THE PREFERRED EMBODIMENTS

Figure 4:
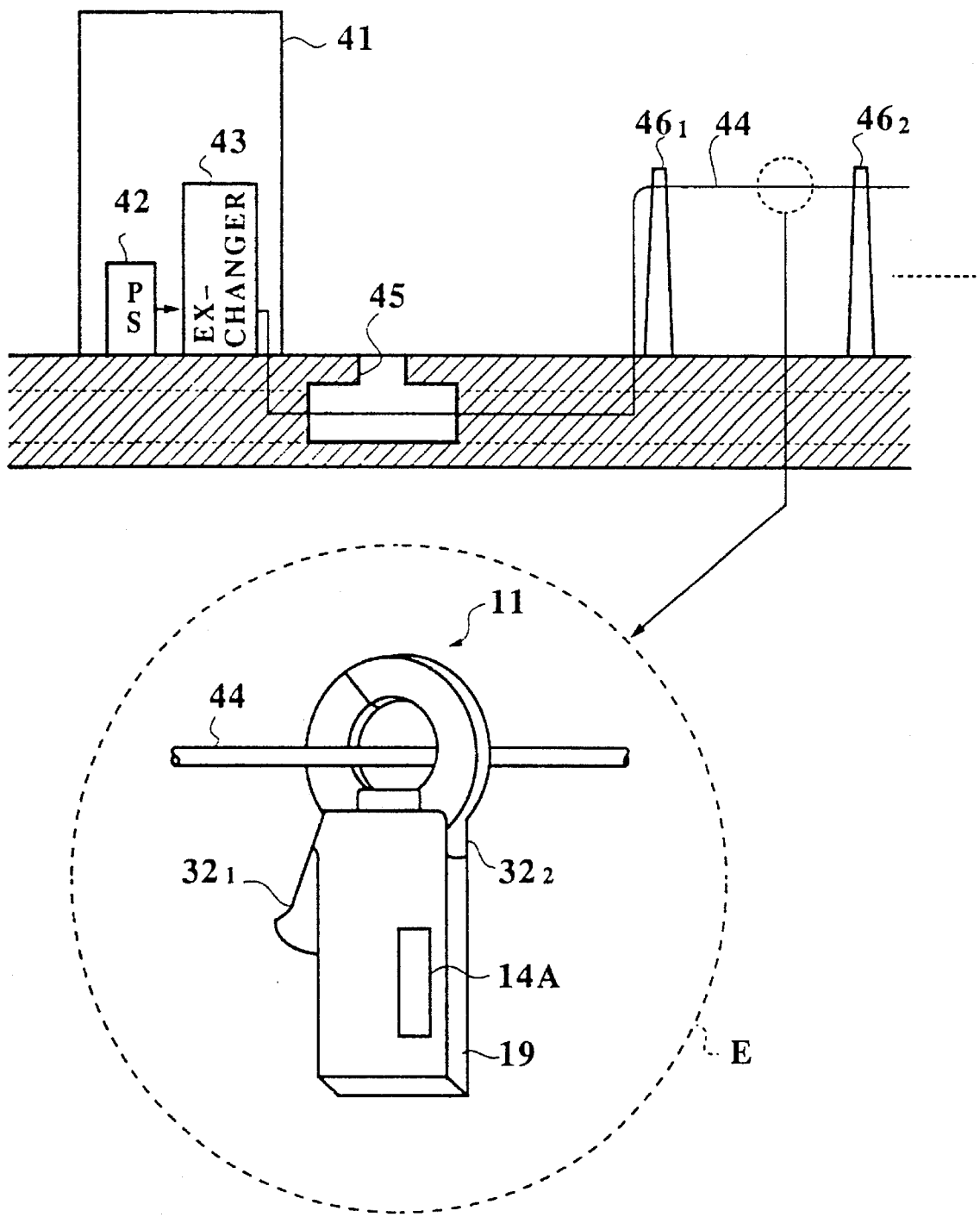
FIG. 4 is a diagrammatic illustration of an exemplary cable status judgement operation state for the apparatus of FIG. 1.

Referring now to FIG. 1, one embodiment of a cable status judgement apparatus according to the present invention will be described In detail.

In this embodiment, the apparatus comprises: a current probe 11 for detecting current from a communication cable; an amplification unit 12 connected with the output of the current probe 11; a judgement unit 13 connected with the output of the amplification unit 12; a display unit 14 having a display surface 14A connected with the output of the judgement unit 13; and a memory 15 connected with a bus terminal in the judgement unit 13.

The judgement unit 13 further comprises: a holding unit 16 connected with the output of the amplification unit 12; a processing unit 17 connected with the output of the holding unit 16 and the memory 15; and a comparison unit 18 connected between the processing unit 18 and the display unit 14.

The amplification unit 12, the judgement unit 13, the display unit 14, and the memory 15 are housed inside a case body 19, where the display surface 14A of the display unit 14 is exposed to a side face of the case body 19.

The current probe 11 has a detailed configuration as shown in FIGS. 2A and 2B, and attached to the case body 19 in a manner shown in FIG. 3.

More specifically, the current probe 11 has a pair of approximately crescent shaped casing members $21_1$ and $21_2$, each of which has one end pivotally supported by a shaft 31 attached between upper center portions of the upper and lower case body members $19_1$ and $19_2$. The casing members $21_1$ and $21_2$ have handle levers $32_1$ and $32_2$ which are extended outward near the pivotal points supported by the shaft 31 on the casing members $21_1$ and $21_2$, respectively, with a spring 33 provided therebetween, where the handle lever 321 is fixed within the case body 19 while the handle lever 322 is exposed outside the case body 19 such that these handle levers 321 and 322 can be clamped by the hand of the worker against the spring 33. The casing member $21_1$ and the handle lever $32_1$ have a connected cavity $22_1$ formed therein, while the casing member $21_1$ and the handle lever $32_2$ have a connected cavity $22_2$ formed therein, and the opening ends of the cavities $22_1$ and $22_2$ at the free ends of the casing members $21_1$ and $21_2$ are equipped with conductive contact members $23_1$ and $23_2$, respectively. The current probe 11 itself is Formed by a helical coil $24_1$ provided within the cavity $22_1$ and having one end attached to the contact member $23_1$, and a helical coil $24_2$ provided within the cavity $22_2$ and having one end attached to the contact member $23_2$, while the other ends of the helical coils $24_1$ and $24_2$ are connected to the amplification unit 12.

Now, FIG. 4 depicts a typical situation in which this apparatus of FIG. 1 is operated by the worker.

Namely, in FIG. 4, an exchange station 41 contains an output power supply equipment (PS) 42 which obtains the DC power of a prescribed voltage from a commercial power supply, and an exchanger 43 operated by the driving voltage supplied from the power supply equipment 42. The cable 44 connected with the exchanger 43 in the exchange station 41 is laid underground through a manhole 45, and via poles $46_1$, $46_2$, etc. provided on the ground, and connected to another station or a terminal device (not shown).

Under such a circumstance, the cable status judgement apparatus of this embodiment Is operated according to the flow chart of FIG. 5 as follows.

First, the core of the cable 44 (which is assumed to be made of metal such as a copper for simplicity here) receives the DC power supply from the terminal device, except for a case of a special common carrier leased line such as a digital transmission line. The DC part of this DC power supply is superposed with the AC components (referred hereafter simply as "power supply noise") which are generated when the power supply equipment 42 rectifies the commercial power supply and generates the prescribed DC voltage, and which are distributed over the frequency bandwidth of about 20 KHz to 80 KHz as shown by a curve A in FIG. 6. On the other hand, inside the exchange station 41, the DC part Is also superposed with the noise due to the contact points of the electromagnetic elements such as relays forming the exchanger 43, this noise is so weak that the communication provided by the operation of the exchanger 43 through the cable 44 is hardly affected by this noise. In addition, the interior of the exchange station 41 is electromagnetically shielded with respect to the external in general, so that the main components of the noise superposed onto the DC part inside the exchange station 41 are those of the power supply noise.

Also, in the section at which the cable 41 is laid outside the exchange station 41 (such as underground or space), the DC part is superposed with various noises caused by the electromagnetic waves arriving from the space or by the induction due to the other cables laid in a vicinity of the cable 44. However, In general, a cable to be a target of the judgement concerning the active/dead status has a length of at most several hundred meters, so that the noises caused by the electromagnetic waves and the induction are biased to be distributed in the high frequency bandwidth of over several GHz.

Figure 5:
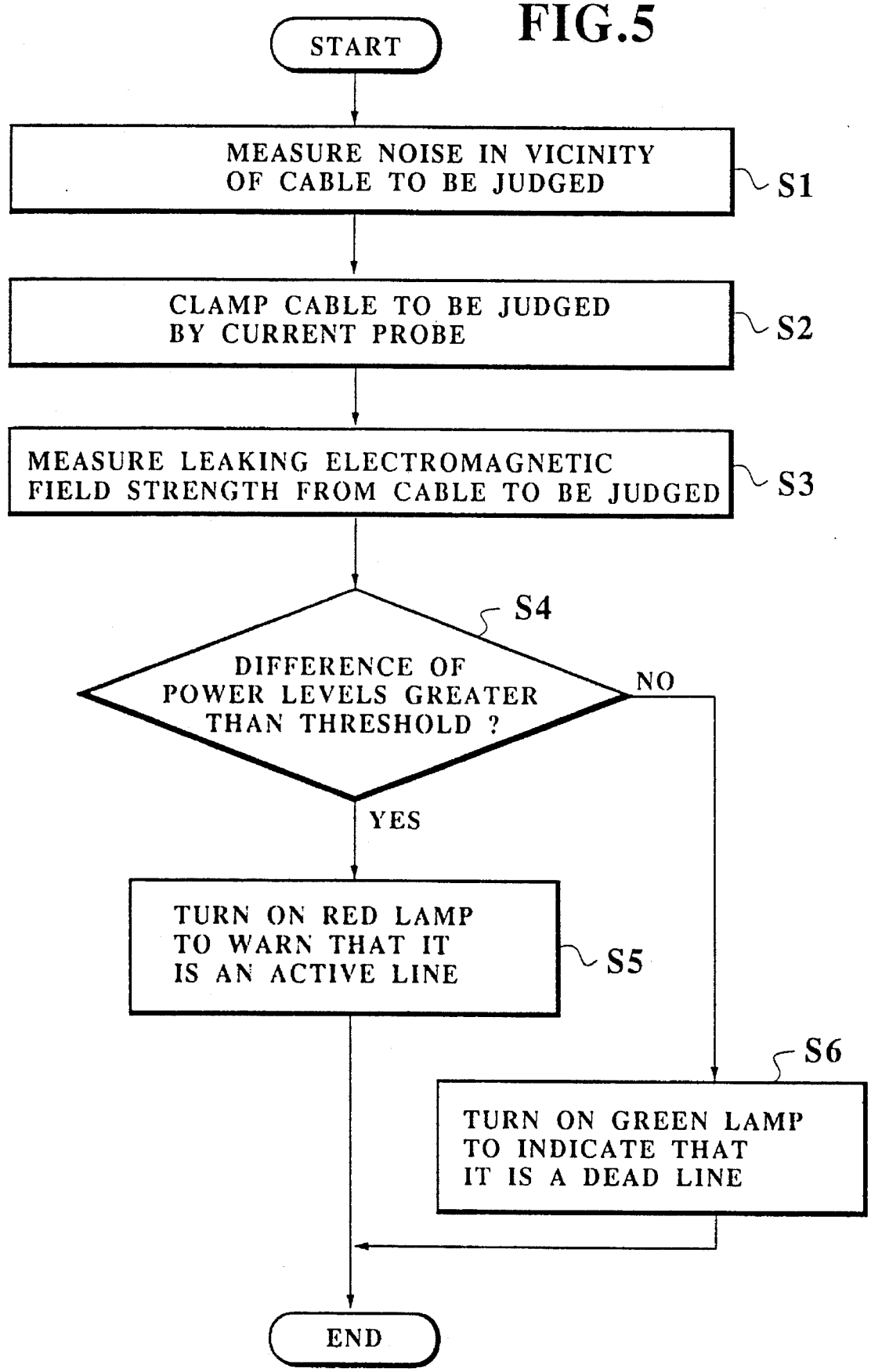
FIG. 5 is a flow chart for the cable status judgement operation by the apparatus of FIG. 1.

In order to carry out the cable status judgement operation for the cable 44, at the step S1 in FIG. 5, the current probe 11 is positioned in the space in a vicinity of the cable 44, without making the current probe 11 to be electromagnetically coupled with the cable 44. In this state, the amplification unit 12 amplifies the noises obtained through the current probe 11 to a prescribed level, and the amplified noises are stored in the holding unit 16.

The processing unit 17 reads out the amplified noises From the holding unit 16, and subjects the amplified noises to pass through a band-pass-filter with the transmission bandwidth of 20 KHz to 80 KHz corresponding to the distribution bandwidth of the main components of the power supply noise, and calculates the average power level of the noise in that transmission bandwidth. The obtained average power level is then stored in the memory 15.

Figure 6:
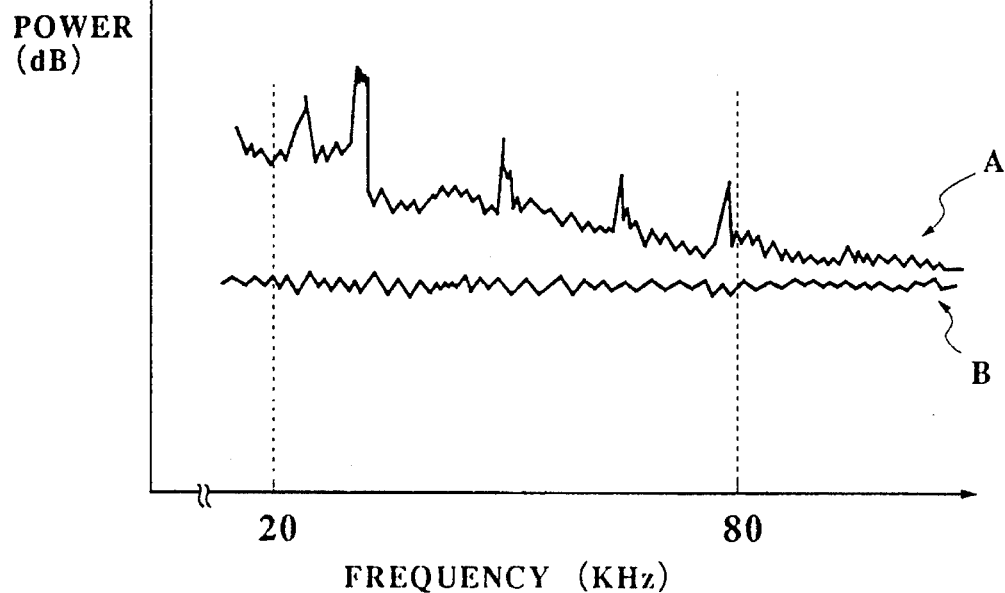
FIG. 6 is a graph of a typical frequency spectrum obtained by the apparatus of FIG. 1.

In this process, the frequency spectrum of the noise obtained through the current probe 11 is that which has been obtained for the space in a vicinity of the cable 44, which can obviously be regarded as a dead line, and which takes the small power level over the wide frequency bandwidth as shown by a curve B in FIG. 6. Consequently, the average power level stored in the memory 15 can be utilized as the reference for judging the active/dead status of the cable subsequently.

Next, at the step S2 in FIG. 5, the worker clamps the handle levers $32_1$ and $32_2$ against the spring 33 to open up the free ends of the casing members $21_1$ and $21_2$, place the cable 44 within a central bore portion of the current probe 11 through the clearance formed between the contact members $23_1$ and $23_2$, and then releases the handle levers $32_1$ and $32_2$ to close the free ends of the casing members $21_1$ and $21_2$ such that the contact members $23_1$ and $23_2$ are put in an electrical contact with each other by the spring 33. As a result, as shown in the enlarged view E shown in FIG. 4, the cable 44 is clamped within the central bore portion of the current probe 11 such that the cable 44 is electromagnetically coupled with the current probe 11 in which the helical coils $24_1$ and $24_2$ are connected in series through the contact members $23_1$ and $23_2$.

Next, at the step S3 in FIG. 5, the current probe 11 detects the leaking electromagnetic field strength of the noises electromagnetically through the helical coils $24_1$ and $24_2$, where the noises includes the power supply noise due to the power supply equipment 42, the relaying operation noise due to the exchanger 43, the transmission carrier in the common carrier leased line, etc. which are superposed onto the DC part of the signals supplied to the cable 44. The amplification unit 12 then amplifies the detected noises to the prescribed level, and the holding unit 16 holds the amplified noises outputted from the amplification unit 12.

Next, at the step S4 in FIG. 5, the processing unit 17 takes out the noises stored In the holding unit 16, obtains the frequency components which pass through the above described band-pass filter, and calculates the average power level for the obtained frequency components of the noises. Then, the comparison unit 18 compares the average power level calculated by the processing unit 17 with the average power level stored in the memory 15 in advance to obtain the difference between them, and judges the cable 44 as the active line when the obtained difference is greater than the predetermined threshold, or judges the cable 44 as the dead line otherwise.

Then, the display unit 14 turns on the green lamp on the display surface 14A when the cable 44 is judged as the active line at the step S5, or turns on the red lamp on the display surface 14A when the cable 44 is judged as the dead line at the step S6.

Thus, according to this embodiment, it is possible to judge the active/dead status of the cable quickly and accurately on a basis of the difference in the frequency spectrum for the noises induced on the active cable and the dead table, without marking the cable, or transmitting the monitor signal, or damaging the outer covering of the cable as required in the prior art methods. In addition, in the cable status judgement operation In this embodiment, there is no need to detach the oscillator or replace the cable with the damaged outer covering, so that the cable cutting or removing work can be carried out easily and quickly.

Consequently, it is possible to prevent the occurrence of the human caused trouble during the work such as the erroneous cutting of the active cable, as the dead cable to be cut or removed can be identified quickly and accurately.

It is to be noted that, in the above described embodiment, the memory 15 stores the average power level of the noises measured in the space that can be regarded as the dead line at a particular bandwidth, but the present invention is not to be limited to this particular case, and the predetermined constant power level may be stored in the memory 15 when the cable type of the cable to be judged can be limited or the work site of the cable status judgement operation can be limited within a certain range.

Also, in the above described embodiment, the average power level of the noises for the dead line is stored in the memory 15 and used as the reference for the judgement, but the present invention is not to be limited to this particular case, and as long as it is possible to judge the difference in the power level or the frequency spectrum between the active cable and the dead cable at the desired precision, the average power level or the frequency spectrum for the active cable may be stored in the memory 15 and used as the reference for the subsequent judgement.

In addition, in the above described embodiment, the display unit 14 displays the judgement result by using the green and red lamps such as LEDs (Light Emission Diodes), but the present invention is not to be limited to this particular case, and the judgement result may be displayed in terms of the characters and symbols by using the other display device such as LCD (Liquid Crystal Display), or the judgement result may be outputted in terms of the acoustic signals in the audible frequency range, for example.

Moreover, when the cable to be judged is limited to the communication cable inside the exchange station, the above described embodiment can be modified as follows.

Figure 7:
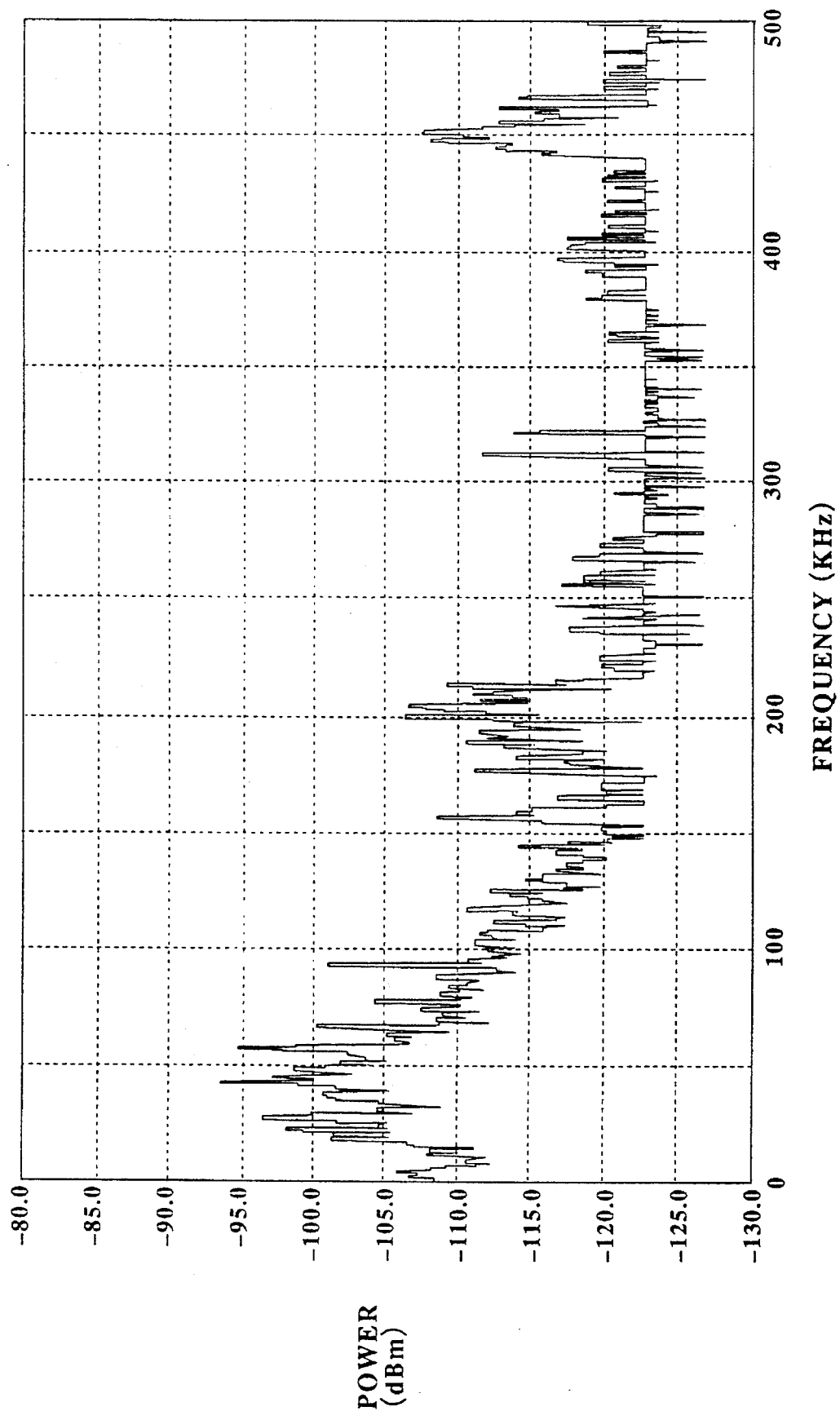
FIG. 7 is a graph of a frequency spectrum obtained by the apparatus of FIG. 1 from a cable inside an exchange station.

Namely, the communication cable inside the exchange station is superposed with the noises such as the switching noise of the power supply equipment, the relay operation noise of the analog exchanger, or the noise due to the DC—DC converter in the digital exchanger, and the waveform of these noises on the frequency axis appears as shown in FIG. 7. As can be seen in FIG. 7, the noises in this case are relatively concentrated around the region of several to 100 KHz.

From the point of view of the cable status judgement according to the present Invention, it is preferable to measure the difference In the leaking electromagnetic field at the region in which the noises are concentrated, because the distinction between the electromagnetic field for the active cable and the electromagnetic field for the dead cable can be made at the higher precision.

Figure 8:
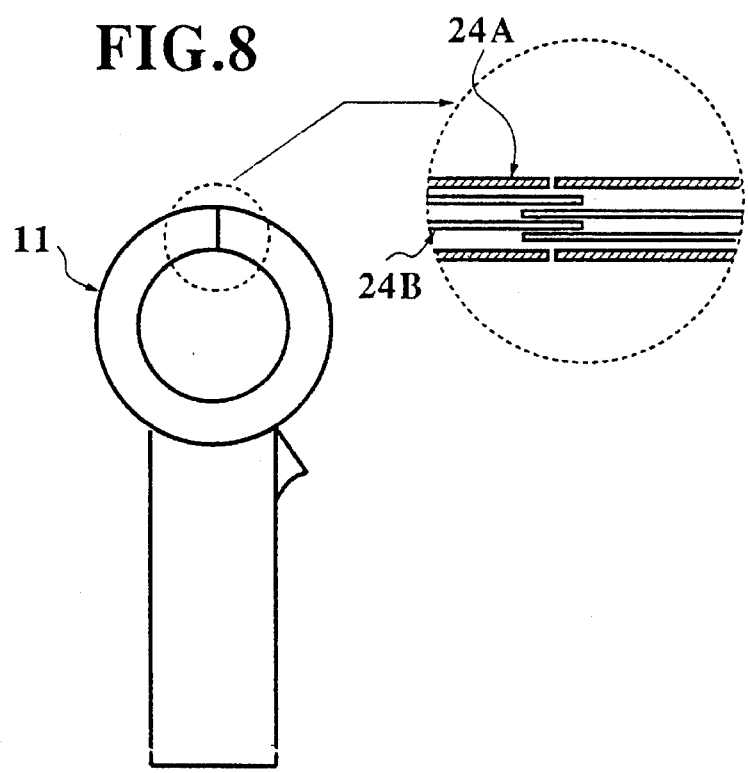
FIG. 8 is an enlarged view of a current probe of the apparatus of FIG. 1 suitable for a case of FIG. 7.

For this reason, In this case, It Is most effective to form the current probe 11 as shown in FIG. 8 in which a pair of conductive members forming a closed loop by being engaged with each other are formed by ring-shaped current detecting permalloy 24B which is covered by ring-shaped shielding permalloy 24A. Then, using this current probe 11 of FIG. 8 in which the electromagnetic induction from the external is prevented as much as possible as a result of the increased current detection effect due to the large permeability of the permalloy, the noise power level can be measured most effectively by detecting and amplifying the leaking electromagnetic field from the cable clamped inside the central bore portion of the current probe 11 through the band-pass filter having the transmission bandwidth set to be ranging from 1 KHz to 100 KHz.

In addition, it is also possible to make the threshold used in the judgement of active/dead status to be variable by means of the software, such that the apparatus can be adapted to the judgement operation under various environments.

Namely, in a case of mainly dealing with the cable inside the exchange station, the actually measured current values is below 10 μA for the dead cable and over 20 μA for the active cable, so that the setting of the threshold which makes the judgements of 11 to 19 μA as indeterminable and over 20 μA as active can be used. However, in a case of dealing with the cable outside the exchange station, the accurate judgement result cannot be obtained with this same threshold setting because of the many external noises. In such a case, there is a need to change the threshold setting to be such that It makes the judgements of over 100 μA as active and below 80 μA as dead, for example. This change of the threshold setting can be realized by providing the interface to the personal computer on the apparatus, and inputting the suitable commands from the personal computer.

Also, as a special case of the above described embodiment, in a case of dealing with the switching type power supply equipment with a constant load, as the generation frequency of the switching noise due to the power supply equipment becomes a constant, it becomes possible to judge the active/dead status of the communication cable inside the exchange station by monitoring the generation frequency of the switching noise alone. Consequently, in this case, It suffices to detects the signals of the particular frequency alone, so that the design of the filter used in conjunction with the current probe 11 can be simplified and the size and the cost of the apparatus as a whole can be reduced.

For example, in a case of the inverter type rectifier device with a constant 100 A loading current, the generation frequency of the switching noise can be expressed as the higher harmonics with about 63 KHz as the fundamental harmonic, so that it suffices to use the filter capable of passing about 63 KHz sharply.

Furthermore, in the above described embodiment, the judgement of the active/dead status has been achieved on a basis of the difference in the power level of the noise in the particular bandwidth between the active cable and the dead cable, but the present invention is not to be limited to this particular case alone, and as long as the frequency spectrum can be obtained at the desired precision, it is also possible to apply the FFT (Fast Fourier Transform) or DFT (Discrete Fourier Transform), or incorporate DSP (Digital Signal Processor) or the other elements, such that the distribution of the frequency spectrum for the noises obtained from the cable to be judged can be obtained by using the filter for filtering the particular frequency bandwidth, and the judgement of the active/dead status can be made according to the difference In distributions such as those indicted by curves A and B in FIG. 6 between the active cable and the dead cable.

Figure 9:
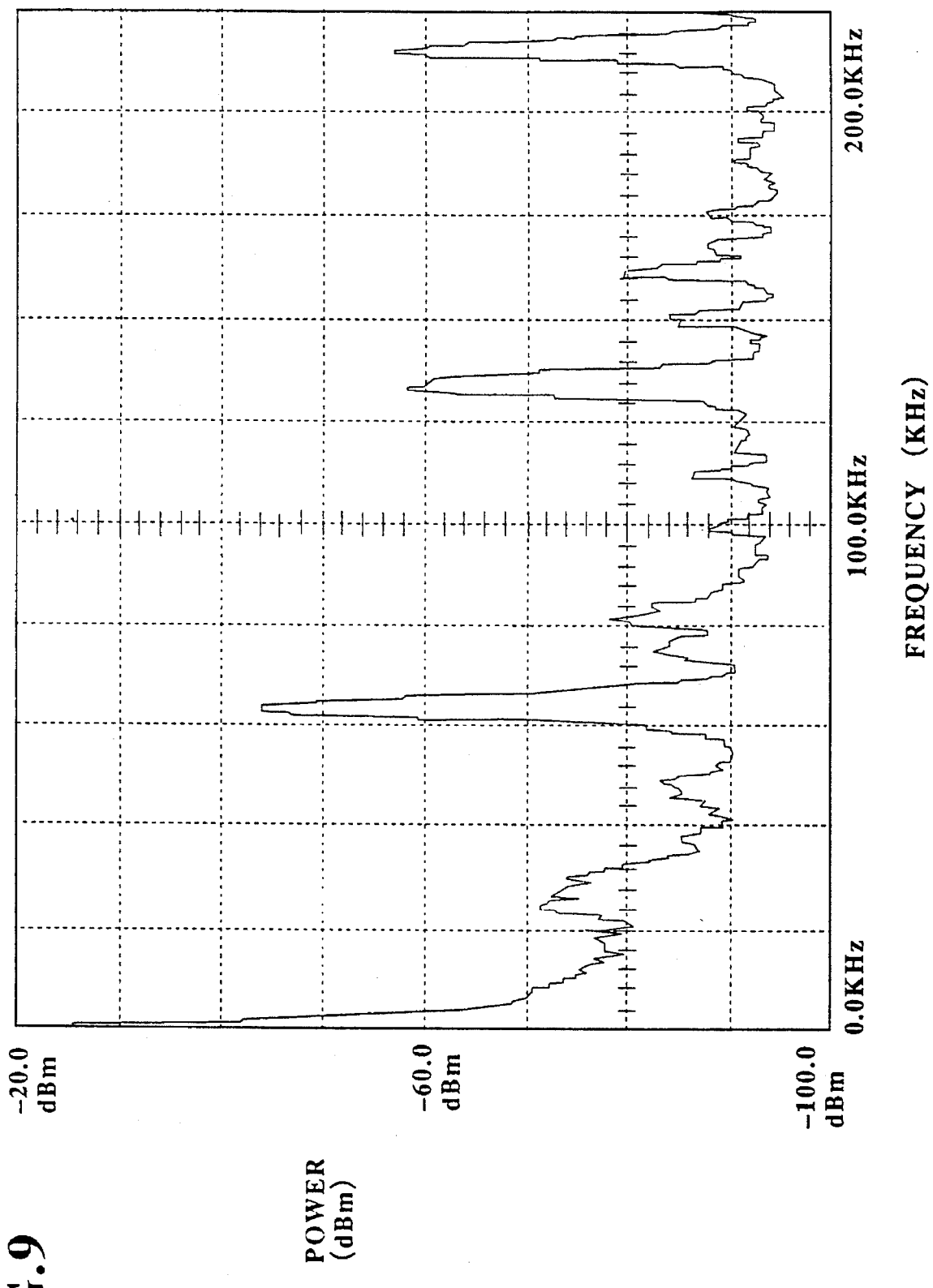
FIG. 9 is a graph of a frequency spectrum obtained by the apparatus of FIG. 1 for a switching type power supply equipment with a constant load.

In such a case, it is also possible to make the judgement by comparing the distributions at a plurality of bandwidths on the frequency spectrum at which the clear distinction between the active cable and the dead cable appears, or by comparing the distributions at the bandwidth obtained by omitting the transmission bandwidth from the frequency axis. For example, the noise distribution in the bandwidth in a vicinity of 200 KHz in FIG. 7 and the noise at the particular frequency of about 63 KHz in FIG. 9 can be added together and the judgement of the active/dead status can be made according to the total of these two bandwidths so obtained.

On the other hand, in recent years, the demand for the transmission of the digital data using the common carrier leased line such as the high speed digital transmission line is increasing drastically, and in view of the scale of the social impact that can be caused by the trouble on such a common carrier leased line, the erroneous cutting of such a common carrier leased line should be avoided as much as possible. In this regard, according to the cable status judgement apparatus of the present invention, it is also possible to judge the active/dead status of the cable to be judged even when the cable contains the common carrier leased line.

Figure 10:
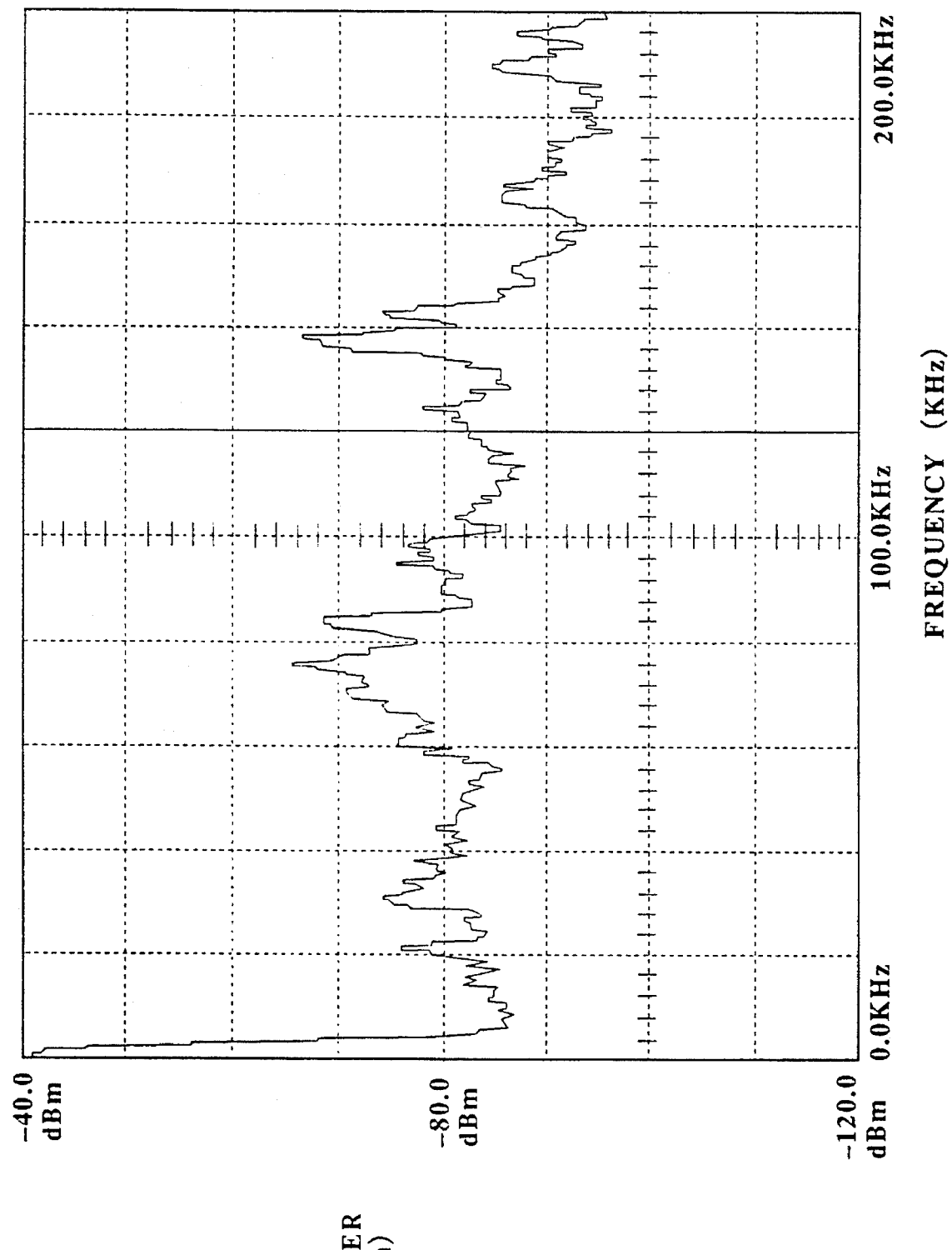
FIG. 10 is a graph of a frequency spectrum obtained by the apparatus of FIG. 1 for a digital transmission line in an active status.
Figure 11:
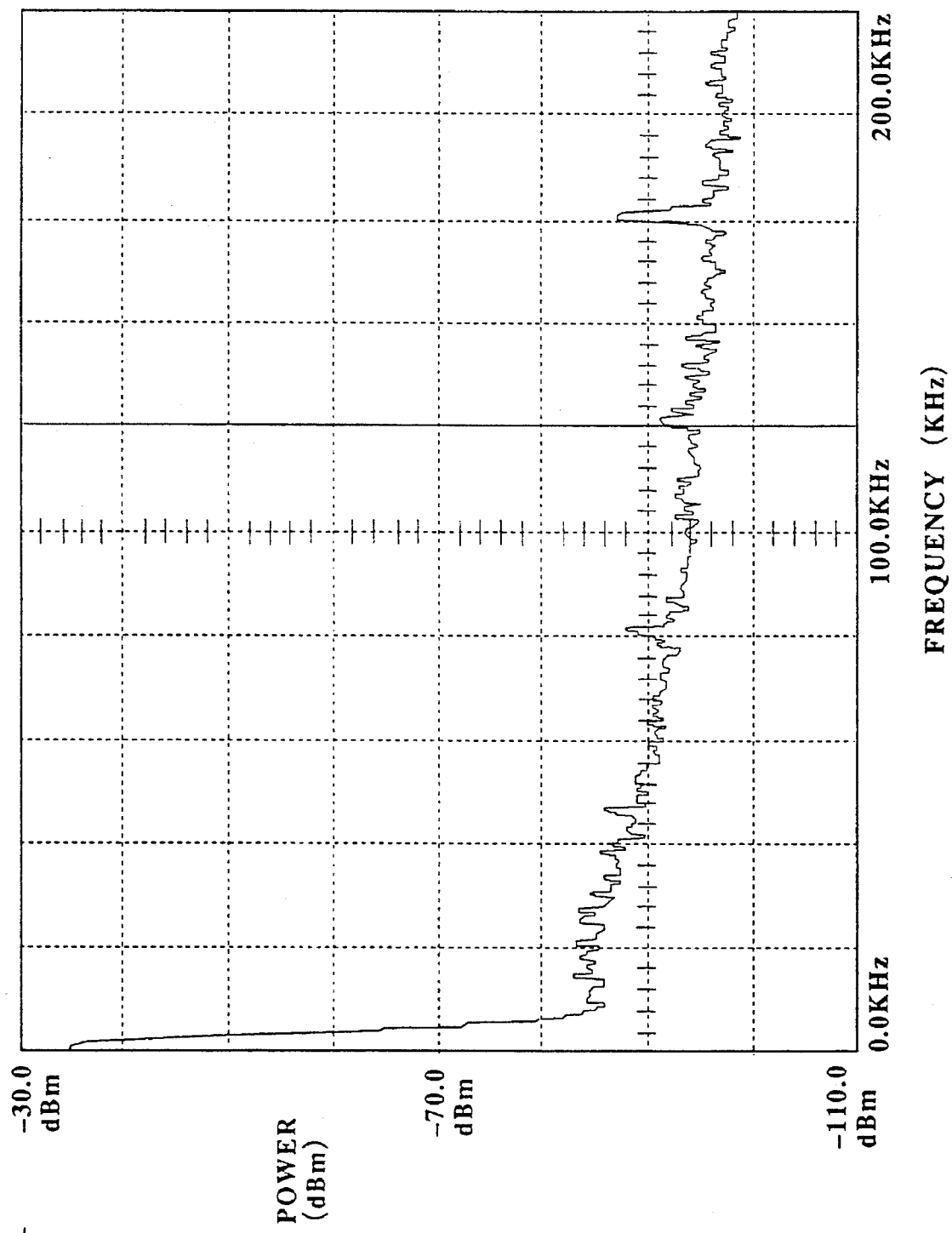
FIG. 11 is a graph of a frequency spectrum obtained by the apparatus of FIG. 1 for a digital transmission line in a dead status.

Namely, in a case of the common carrier leased line, unlike the public lines, it is normally in a state in which the prescribed voltage is not supplied, so that the detection of the noise due to the rectifier device is impossible. However, in such a common carrier leased line, the carrier is always flowing in the waiting or using state of the transmission line, so that by measuring the leaking electromagnetic field due to the leakage of the carrier to the external of the cable, it is possible to obtain the waveform as shown in FIG. 10 for the active cable, or the waveform as shown in FIG. 11 for the dead cable. Then, according to the difference in the power level of the noises in the bandwidth of up to 100 KHz in these measured waveforms, the judgement of the active/dead status can be made similarly as in the above described embodiment.

In this case, the waveform of the frequency spectrum around the communication cable to be judged differs largely for the active cable and the dead cable as shown in FIGS. 10 and 11, so that the active/dead status can be judged by comparing the waveforms on the Braun tube and identifying the corresponding status of the cable according to the comparison result.

In addition, the configuration of the current probe 11 is not to be limited to that using the helical coils or the permalloy as described above, and as long as it can electromagnetically coupled with the cable through its outer covering, any known configuration may be used instead.

Besides those already mentioned, many modifications and variations of the above embodiments may be made without departing from the novel and advantageous features of the present invention. Accordingly, all such modifications and variations are intended to be included within the scope of the appended claims.

What is claimed is:

1. A method for judging an active/dead status of a communication cable, comprising the steps of:

storing in advance data representing a frequency spectrum of signals on a communication cable measured in a state in which the communication cable is known to be active/dead;

measuring the data representing the frequency spectrum of the signals on a communication cable to be judged by detecting signals on the communication cable to be judged while electromagnetically coupling a probe to the communication cable to be judged; and judging the active/dead status of the communication cable to be judged according to a result of comparing a prescribed threshold with a difference of the data representing the frequency spectrum stored at the storing step and the data representing the frequency spectrum measured at the measuring step.

2. The method of claim 1, wherein the data representing the frequency spectrum is an average electric power level of the frequency spectrum In a prescribed bandwidth.

3. The method of claim 2, wherein the prescribed bandwidth corresponds to a bandwidth in which main components of noises for the signals on the communication cable to be judged are distributed.

4. The method of claim 2, wherein the data representing the frequency spectrum Is that of a switching noise due to a switching type power supply equipment having a constant load, and the prescribed bandwidth Is a generation frequency of the switching noise.

5. The method of claim 1, wherein the data representing the frequency spectrum is a distribution of the frequency spectrum.

6. The method of claim 5, wherein the distribution of the frequency spectrum is a distribution in a plurality of prescribed bandwidths.

7. The method of claim 5, wherein the distribution of the frequency spectrum is a distribution in a bandwidth other than a transmission bandwidth of the signals on the communication cable to be judged.

8. The method of claim 1, wherein the data representing the frequency spectrum is a waveform of the frequency spectrum.

9. The method of claim 1, wherein the data representing the frequency spectrum stored at the storing step is a predetermined constant electric power level.

10. The method of claim 1, wherein the data representing the frequency spectrum stored at the storing step is that of noises detected in vicinity of the communication cable to be judged without electromagnetically coupling the probe to the communication cable to be judged.

11. An apparatus for judging an active/dead status of a communication cable, comprising:

memory means for storing in advance data representing a frequency spectrum of signals on a communication cable measured in a state in which the communication cable is known to be active/dead;

measurement means having a probe for measuring the data representing the frequency spectrum of the signals on a communication cable to be judged by detecting signals on the communication cable to be judged while electromagnetically coupling the probe to the communication cable to be judged; and judgement means for judging the active/dead status of the communication cable to be judged according to a result of comparing a prescribed threshold with a difference of the data representing the frequency spectrum stored by the memory means and the data representing the frequency spectrum measured by the measurement means.

12. The apparatus of claim 11, wherein the data representing the frequency spectrum is an average electric power level of the frequency spectrum In a prescribed bandwidth.

13. The apparatus of claim 12, wherein the prescribed bandwidth corresponds to a bandwidth in which main components of noises for the signals on the communication cable to be judged are distributed.

14. The apparatus of claim 12, wherein the data representing the frequency spectrum is that of a switching noise due to a switching type power supply equipment having a constant load, and the prescribed bandwidth is a generation frequency of the switching noise.

15. The apparatus of claim 11, wherein the data representing the frequency spectrum is a distribution of the frequency spectrum.

16. The apparatus of claim 15, wherein the distribution of the frequency spectrum is a distribution in a plurality of prescribed bandwidths.

17. The apparatus of claim 15, wherein the distribution of the frequency spectrum is a distribution in a bandwidth other than a transmission bandwidth of the signals on the communication cable to be judged.

18. The apparatus of claim 11, wherein the data representing the frequency spectrum is a waveform of the frequency spectrum.

19. The apparatus of claim 11, wherein the data representing the frequency spectrum stored by the memory means is a predetermined constant electric power level.

20. The apparatus of claim 11, wherein the data representing the frequency spectrum stored by the memory means is that of noises detected in vicinity of the communication cable to be judged without electromagnetically coupling the probe to the communication cable to be judged.

* * * * *